United States Patent [19]
Chien et al.

[11] Patent Number: 5,413,953
[45] Date of Patent: May 9, 1995

[54] METHOD FOR PLANARIZING AN INSULATOR ON A SEMICONDUCTOR SUBSTRATE USING ION IMPLANTATION

[75] Inventors: Sun-Chieh Chien; Ming-Hua Liu, both of Hsin-Chu, Taiwan, Prov. of China

[73] Assignee: United Microelectronics Corporation, Hsihchu, Taiwan, Prov. of China

[21] Appl. No.: 315,706

[22] Filed: Sep. 30, 1994

[51] Int. Cl.⁶ .................................. H01L 21/76
[52] U.S. Cl. ........................... 437/69; 437/70; 437/228; 216/38; 216/48; 216/62; 216/67; 216/87; 216/99
[58] Field of Search .............. 437/228, 69, 70; 156/628, 654

[56] References Cited

U.S. PATENT DOCUMENTS

| | | | |
|---|---|---|---|
| 4,514,251 | 4/1985 | Van Ommen et al. | 156/628 |
| 4,539,744 | 9/1985 | Burton | 29/580 |
| 4,634,494 | 1/1987 | Taji et al. | 156/628 |
| 4,652,234 | 3/1987 | Jain et al. | 156/628 |
| 4,962,064 | 10/1990 | Haskell et al. | 437/228 |
| 4,965,221 | 10/1990 | Dennison et al. | 437/69 |
| 4,988,405 | 1/1991 | Martin, Jr. et al. | 437/228 |
| 5,019,526 | 5/1991 | Yamane et al. | 437/70 |
| 5,169,801 | 12/1992 | Saito | 437/195 |
| 5,204,288 | 4/1993 | Marks et al. | 437/228 |
| 5,219,766 | 6/1993 | Fukunaga | 437/69 |
| 5,236,861 | 8/1993 | Otsu | 437/67 |
| 5,300,463 | 4/1994 | Cathey et al. | 437/228 |

FOREIGN PATENT DOCUMENTS

| | | | |
|---|---|---|---|
| 0023485 | 2/1979 | Japan | 156/628 |
| 0198730 | 9/1986 | Japan | 156/628 |
| 0222137 | 10/1986 | Japan | 156/628 |
| 0189926 | 7/1989 | Japan | 156/628 |
| 0209534 | 7/1992 | Japan | 437/69 |

*Primary Examiner*—Brian E. Hearn
*Assistant Examiner*—Trung Dang
*Attorney, Agent, or Firm*—George O. Saile

[57] ABSTRACT

An improved process for fabricating a planar field oxide structure on a silicon substrate was achieved. The process involves forming the field oxide by using the LOCal Oxidation of Silicon (LOCOS) process in which the device area is protected from oxidation by a silicon nitride layer. A sacrificial implant layer, such as CVD oxide, oxynitride or an anti-reflective coating (ARC) layer is used to fill in the gap between the silicon nitride and the field oxide structure and make more planar the substrate surface. The substrate surface is then implanted with $As^{75}$ or $p^{31}$ ions penetrating the sacrificial implant layer and forming a implant damaged layer on the field oxide. The implant damaged layer which etches faster in a wet etch in removed selectively thereby making a more planar field oxide structure. The method does not require a recess to be etched in the silicon substrate and therefore, has certain reliability and cost advantages. The invention also describes a method for forming more gradually sloping steps on the field oxide structure without using a sacrificial layer and a method for planarizing a CVD over a patterned conducting layer using photoresist or spin-on-glass as the sacrificial implant layer.

33 Claims, 4 Drawing Sheets

METHOD FOR PLANARIZING AN INSULATOR ON A SEMICONDUCTOR SUBSTRATE USING ION IMPLANTATION

BACKGROUND OF THE INVENTION (1) Field of the Invention

The present invention relates to a method for planarization the silicon oxide layers on semiconductor substrates for integrated circuit devices. More particularly the invention is directed to a method for planarizing the Field OXide (FOX) isolation structure on a silicon substrate formed by the LOCal Oxidation of Silicon (LOCOS) method.

(2) Description of the Prior Art

Today's Ultra Large Scale Integration (ULSI) on the semiconductor substrate is in part due to advances in high resolution photolithographic techniques and to advances in plasma etching of the various conducting and insulating layers on the substrate. However, the accumulated effect of depositing and etching of patterns in these layers, one patterned layer on top of the other, has resulted in irregular or substantially non-planar surfaces with micrometer and submicrometer feature sizes on an otherwise microscopically planar substrate.

These irregular surface features cause a number of process and reliability problems. For example, during plasma etching to pattern conducting layers, the directional or anisotropic etching can leave residue, often referred to as rails or stringers at the edges of the underlying surface irregularities. This results from the fact that conformal conducting layers formed over steps are thicker in the vertical direction on the sidewall of the step than they are on the horizontal surface. The directionality of the plasma etching which etches predominantly in the vertical direction leaves residue from the conducting layer on the sidewalls of the step. This then results in electrical shorts between adjacent patterned conducting layers that are used to connect or wire up the various devices.

One processing area where this residue can be a major problem is the patterning by anisotropic etching of the polysilicon gate electrode for FETs and the word and bit lines that are used on integrated circuit, such as on DRAMs, SRAMs and microprocessor chips. When these conducting layers are patterned over the Field OXide (FOX) structure formed to electrically isolate the device area, residue can remain at the relatively steep steps at the edge of the field oxide.

Typically the conventional field oxide isolation is formed using a LOCal Oxidation of Silicon (LOCOS) process in which the device area is masked with a thin protective pad oxide and a thicker silicon nitride layer that is a barrier to oxidation. The silicon substrate is then oxidized to form the field oxide having a thickness of about 4500 to 5500 angstroms. By the nature of the oxidation, which results in a volume expansion, approximately one half of the oxide thickness extends above the original substrate surface and about one half below the surface.

When the silicon nitride layer and the pad oxide layer are removed from over the device area and a polysilicon gate electrode is patterned by photoresist masking and anisotropic etching, there remains on the edge of the field oxide residual polysilicon which is difficult to remove without excessive over etching.

The reliability of conducting lines formed over large steps in the underlying substrate is also of major concern. For example, thinning of the line or voids formed therein can be a source of electrical failure when the circuit is powered up.

One general approach in the semiconductor industry to circumvent these topographic problems, is to provide a planar surface on which the conducting layer is patterned. A method commonly used to form a planar field oxide, is to recess first the silicon substrate in the field oxide area by etching a trench or recess and then growing a thermal oxide therein. Alternatively, the recess can be filled using a chemical vapor deposited (CVD) silicon oxide and then planarized, for example, by either chemical/mechanical polishing the CVD oxide to remove the raised portion of the CVD oxide. Another approach is to fill the recess with CVD oxide and then planarize the CVD oxide by applying a leveling material such as spin-on-glass (SOG) and etching back the SOG and the CVD to the substrate surface using a non-selective plasma etching. This later approach using a CVD oxide filled recess process is described by T. Otsu in U.S. Pat. No. 5,236,861. Another method for forming a planar thermal oxide in a recessed field oxide area is described by G. Burton in U.S. Pat. No. 4,539,744.

Although recessing the field oxide area and then filling with a deposited or thermally grown oxide, is a viable process, there are a number of concerns. For example, forming recesses in the single crystal silicon substrate having sharp corners and then forming a thick thermal oxide can lead to crystalline defects that can degrade device performance. Also the process complexity is increased with increasing manufacturing costs. Therefore, there is a strong need to provide a simple and effective method for forming a planar field oxide without the necessity of forming recesses in the silicon substrate.

SUMMARY OF THE INVENTION

It is one object of the invention, as shown by a first embodiment, to provide an improved Field OXide (FOX) structure having gradually sloping edges on the FOX structure, where the field oxide is formed by the LOCOS process.

It is another object of this invention, as shown by the second embodiment, to provide an improved planar Field OXide (FOX) isolation structure. The FOX being made more planar by ion implantation through a sacrificial implant layer and then etching.

It is still another object of the invention, as shown by a third embodiment, to provide an improved planar insulating layer over patterned conducting layer by ion implantation and etching.

In accordance with the first embodiment, the invention teaches a new method for forming a field oxide structure having more gradually sloped edges. The sloped edges provide an improved surface for patterning the conducting layers, which have submicrometer feature sizes. The patterned conductive layer being free of residue at the edge of the underlying field oxide areas that would otherwise cause electrical shorts on a less planar surface.

The method begins by providing a substrate having a planar surface comprising of single crystal silicon. The LOCOS process is now used to form the FOX structure This is accomplished in the following way. The principle surface of the substrate is thermally oxidized to form a thin stress-free silicon oxide layer, usually referred as a pad oxide. A first insulating layer, composed of silicon nitride, is then deposited over the pad oxide and provides a barrier to oxidation. The first insulating layer, composed of silicon nitride, is patterned using conventional photolithographic techniques and anisotropic plasma etching leaving portions over the areas required for active device areas and exposing the surface elsewhere on the silicon substrate. The photoresist mask is then removed.

The substrate is now subjected to a thermal oxidation step, thereby forming, a relatively thick Field OXide (FOX) composed of $SiO_2$ in the exposed substrate areas while the silicon nitride layer masks the device areas from oxidation. Approximately one half of the field oxide thickness extends above the substrate surface and having a steep step at the pattern edge.

Relating now more specifically to the object of the first embodiment of the invention, the substrate is implanted in an implanter with ions, such as Arsenic ($As^{75}$) or phosphorus ($p^{31}$) at an angle of about 45 degrees with respect to a line normal to the substrate surface, usually referred to as the tilt angle. During implantation the substrate is also rotated about an axis parallel to the same normal line. The implant forms an implant damage layer in the field oxide structure, while the silicon nitride masks the single crystal silicon device area from implant damage.

The substrate is then subjected to a wet etch, such as in a buffered hydrofluoric acid (BF) to remove the implant damaged oxide layer, which etches approximately 2 to 4 times faster than the undamaged portion of the field oxide. Because of the 45 degree implant angle, the edge of the field oxide structure is more extensively implant damaged than elsewhere and therefrom etches more rapidly in a wet etch. This results in a gradual slope on the field oxide edge, which provides an improved surface upon which to forming the patterned conducting layers.

Relating now more specifically to the object of the second embodiment of the invention, after forming the field oxide (FOX), as described in the first embodiment, a thin sacrificial second insulating layer, such as a CVD silicon oxide or oxynitride is deposited on the substrate, thereby filling in the gaps between the patterned silicon nitride layer and the raised portion of the surrounding field oxide. A thin sacrificial layer is also formed over the field oxide surface.

The substrate is then implanted with $As^{75}$ or $p^{31}$ ions being of sufficient energy to penetrate the thin sacrificial layer and thereby result in implant damage to the top portion of the field oxide structure. The thick portion of the sacrificial layer in the gap protects the field oxide adjacent to the patterned silicon nitride edge from implant damage. This would otherwise cause a ditch or grove to form in the field oxide during the etch back step causing later processing problems.

The substrate is then subjected to a wet etch, such as in a diluted hydrofluoric (HF) acid, to removed the sacrificial layer and the damaged top portion of the field oxide structure, thereby forming a planar structure. The damaged Oxide etching faster than the undamaged oxide. The silicon nitride is then stripped, such as in hot phosphoric acid ($H_3PO_4$) to prepare the substrate for further processing.

Relating now more specifically to the objective of the third embodiment, a method is described for planarizing an insulating layer over a patterned conducting layer. For example, such as is used for forming the gate electrodes on field effect transistors, or the patterned metal lines used as the interconnecting metallurgy on integrated circuits. The insulating layer, deposited, for example, by LPCVD and composed of silicon oxide, is coated with a thin planarizing layer, such as photoresist. The leveling effect of the photoresist fills in the recesses between the patterned conducting layer while leaving a thin layer over the patterned conductor areas. The substrate is now implanted with arsenic or phosphorus ions and with sufficient energy to penetrate the thin photoresist layer over the patterned conducting layer and thereby form implant damage in the top portion of the CVD silicon oxide. This substantially increases the etch rate of the damage layer. The photoresist being sufficiently thick in the recess to mask the CVD oxide from implant damage.

The photoresist is then stripped and a wet etch in buffered hydrofluoric acid is carried out to rapidly remove the implant damaged CVD oxide while etching much slower the undamaged oxide and thereby making more planar the CVD oxide over the patterned conducting layer.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

Now in keeping with the objects of the first embodiment of the invention, the method for sloping the edges of a field oxide (FOX) structure, formed by the LOCal Oxidation of silicon (LOCOS) process, is covered in detail. The field oxide (FOX) structure is used to electrically isolate the active device areas for devices, such as field effect transistors (FETs) that are currently used in the manufacture of DRAMs, SRAM , microprocessor and other similar circuits.

Although the invention is described for use with FET device structures, it should be well understood by one skilled in the art that the planar field oxide structure can be used for other integrated circuit applications, such as shallow isolation on bipolar circuits and the likes. Although the invention is shown for a P-doped substrate, for simplicity, it should also be well understood by those skilled in the art that the invention equally applies to N-doped substrates and to substrates having N and P-wells from which CMOS circuits can be built.

Figure 1:
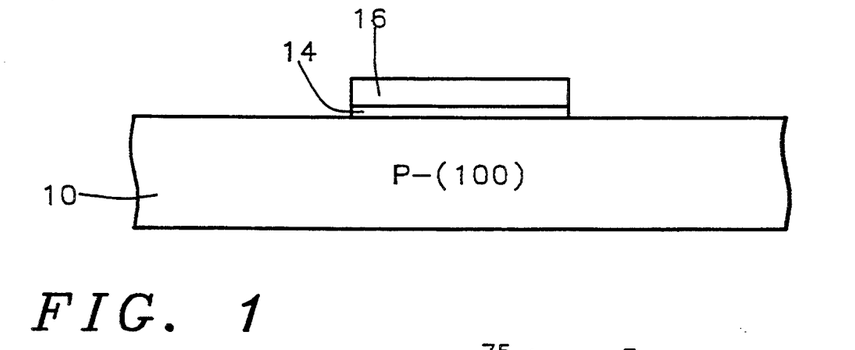
FIGS. 1 through 3 schematically illustrates in cross sectional representation the substrate for the first embodiment for forming the gradually sloped edges on the FOX structure.

Referring now to FIG. 1, a schematic cross-sectional view of a silicon substrate 10 is shown, having a relatively thin thermally grown oxide layer 14 formed on the substrate surface and usually referred to as the pad oxide. The layer 14 is typical between about 100 to 500 Angstroms thick and is formed having a low stress. A thicker silicon nitride layer 16 is then deposited on the pad oxide layer 14. The method of choice for depositing the silicon nitride layer 16 is by low pressure chemical vapor deposition (LPCVD) at the relatively high temperature of between about 700° to 800° C. The preferred thickness being between about 1000 to 2500 Angstroms, but more specifically having a thickness of about 1500 Angstroms.

The silicon nitride layer is then patterned using conventional photolithographic techniques and plasma etching, as shown in FIG. 1 after photoresist removal, to leave portions of the silicon nitride layer 16 over the device areas, as defined by the mask set for the specific product being built.

Figure 2:
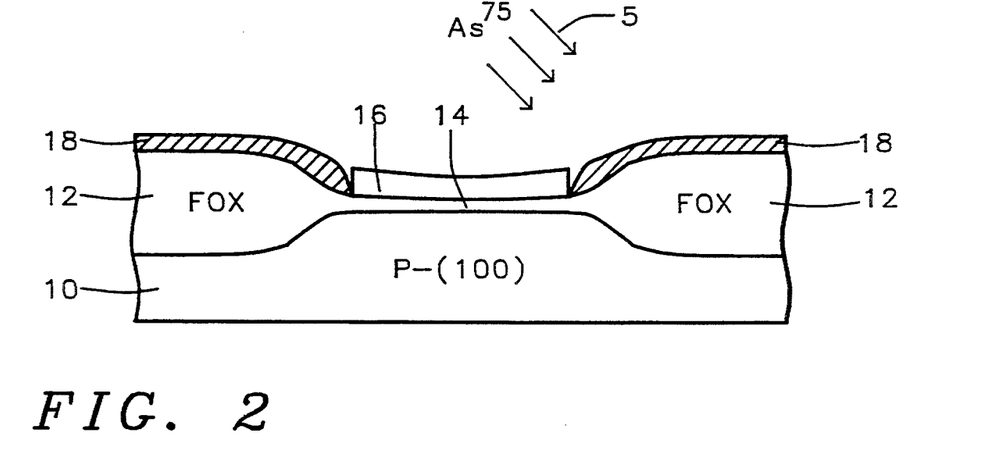

Referring now to FIG. 2, the field oxide 12 is formed by selective thermal oxidation of the surface in the exposed silicon areas, while the silicon nitride layer 16 prevents oxidation in the device areas. This method of forming the field oxide (FOX) is commonly used in the semiconductor industry and referred to as LOCal Oxidation of Silicon (LOCOS). If required to prevent surface inversion, a P-type dopant, such as boron can be implanted in the field oxide area, prior to forming the field oxide. This is commonly done to avoid leakage currents or shorts from occurring between device areas. For this invention, the preferred thickness of the field oxide 12 is between about 4000 to 8000 Angstroms.

As can also be seen in FIG. 2, the formation of the field oxide 12, resulting from the nature of the oxidation, has approximately one half of the total thickness extending upward above the substrate surface and about one half extending below the substrate surface. The relatively large oxide step at the fields oxide edge, about 2000 to 4000 Angstroms in height, can result in residual polysilicon remaining when the overlying polysilicon layers are patterned by anisotropic etching. This residue, often referred to as stringers or rails, can occur when polysilicon gate electrodes and word lines are formed on product, such as DRAM and SRAM chips.

Referring now more specifically to the objective of the first embodiment of this invention, the method of eliminating this problem by forming gradually sloping edges on the field oxide by implanting ions and etching the field oxide structure is now described in detail.

Still referring to FIG. 2, the substrate 10 is placed in an ion implant chamber and the chamber is typically evacuated to a pressure of less than $10^{-6}$ torr. The substrate is then positioned so that the tilt angle is preferably between about 0 to 60 degrees and more specifically at a tilt angle of 45 degrees. The tilt angle being the angular distance in degrees between a line drawn perpendicular to the substrate surface, generally referred to as the normal to the surface, and the ion beam direction. The substrate is then rotated about an axis which is also normal to the substrate surface.

The substrate having the field oxide 12 thereon and the silicon nitride layer 16 still protecting the device area, is then implanted with arsenic ($As^{75}$) ion having a preferred dose of greater than $2\ E\ 13$ ions/cm$^2$ and at an ion implant energy of between about 50 to 100 KeV. However, the ion implant energy should not exceed 100 KeV so as to avoid forming a trench in the field oxide at the silicon nitride edge, which can cause device problems at a later processing steps. Alternatively, the substrate can also be implanted with phosphorus ($p^{31}$) ions having a preferred dose of greater than $5\ E\ 13$ ions/cm$^2$ and an energy of about 30 to 50 KeV.

Figure 9:
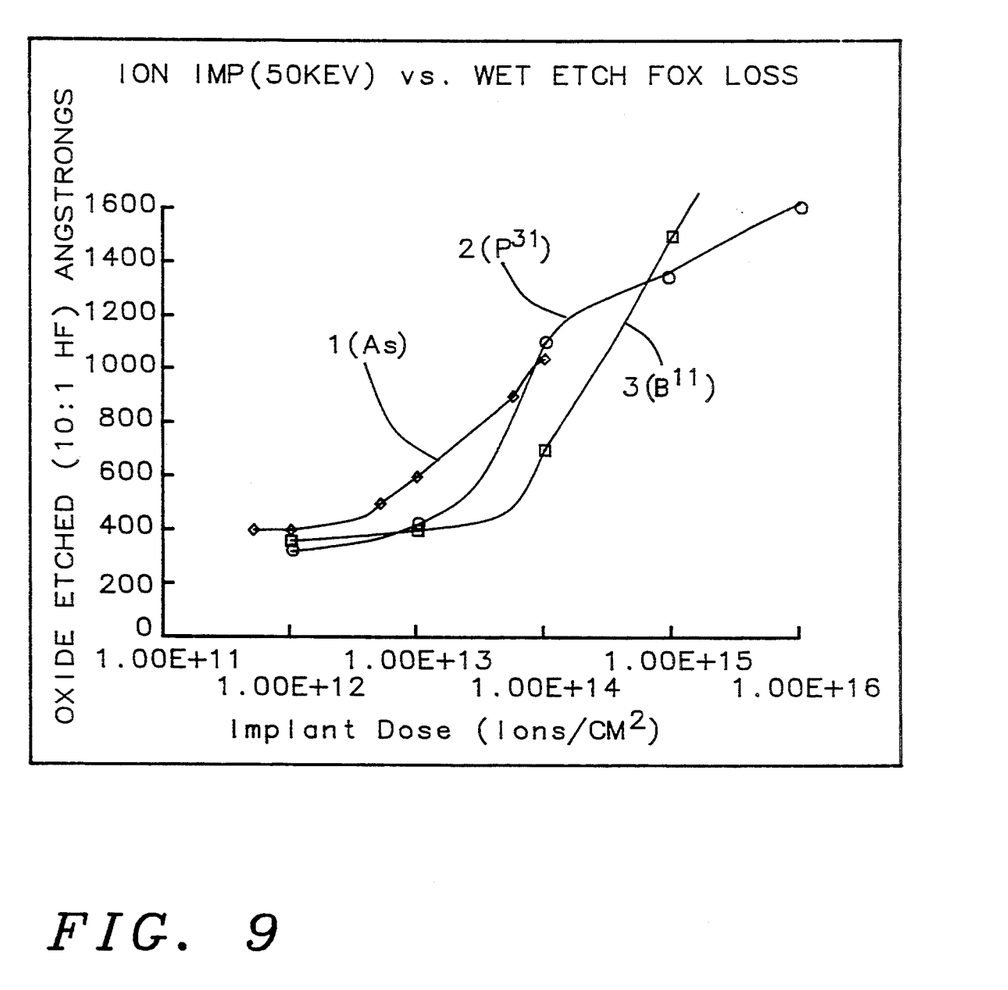
FIG. 9 is a plot of the removal of thermally grown silicon oxide as a function of the ion implant dose in a wet etch of 10:1 buffered hydrofluoric acid.

The substrate is now subjected to a wet etch. The preferred etch being done in a solution of deionized water (DI water) and hydrofluoric acid (HF) having a volume ratio of about 10 to 1. Now to better understand the invention, reference is made to FIG. 9, in which the wet etch removal rate of thermally grown silicon oxide, such as FOX, as a function of the ion implant dose, is shown. The implant energy is 50 KeV and the oxide thickness removed is for an etch time of 1 minutes. As seen in FIG. 9, the etch rate increases significantly as the ion dose in the oxide is increased. For example, when the $As^{75}$ dose in greater than about $5\ E\ 13$ ions/cm$^2$, the silicon oxide removed by the etch is about 2.5 times faster than the low dose implant, for example, less than about $5\ E\ 11$ ions/cm$^2$, as shown by curve 1 in Fig.9. Similar oxide removal curves, labeled 2 and 3, are shown in FIG. 9 respectively for phosphorus ($p^{31}$) and boron ($B^{11}$) ion implants. The boron ions are less effective at creating damage because of their low atomic weight.

Referring again to FIG. 2 it is clearly seen, from geometrical considerations, that the ion implant direction at the edge of the field oxide 12 is approximately at a normal incidence ( 90 degrees) to the surface, as shown by the arrow 5 in FIG. 2, while elsewhere on the field oxide surface the ion incident angle is about 45 degrees. As a result, the projected range or depth of the ions are greater at the edge of the field oxide structure 12. The wet etch then results in the removal of a greater portion of the oxide at the oxide edge, as indicated in FIG. 2 by the cross hatched area 18, and thereby forming a more gradually sloping step.

Figure 3:
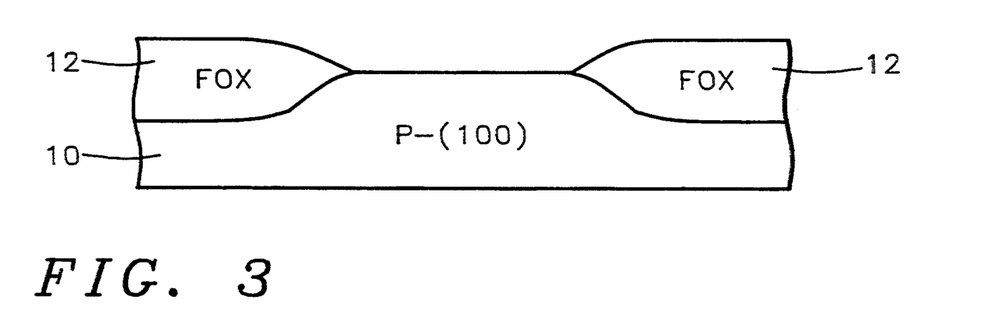

Referring now to FIG. 3, the silicon nitride layer 16 is removed, preferable in a hot phosphoric acid ($H_3PO_4$) solution at a temperature of between about 150° to 160° C. for about 60 to 90 minutes and the pad oxide layer 14 is removed, preferable in a buffered hydrofluoric (BHF) acid solution. The silicon substrate having the improved field oxide (FOX) 12 surrounding and electrically isolating the device areas is now completed.

Figure 4:
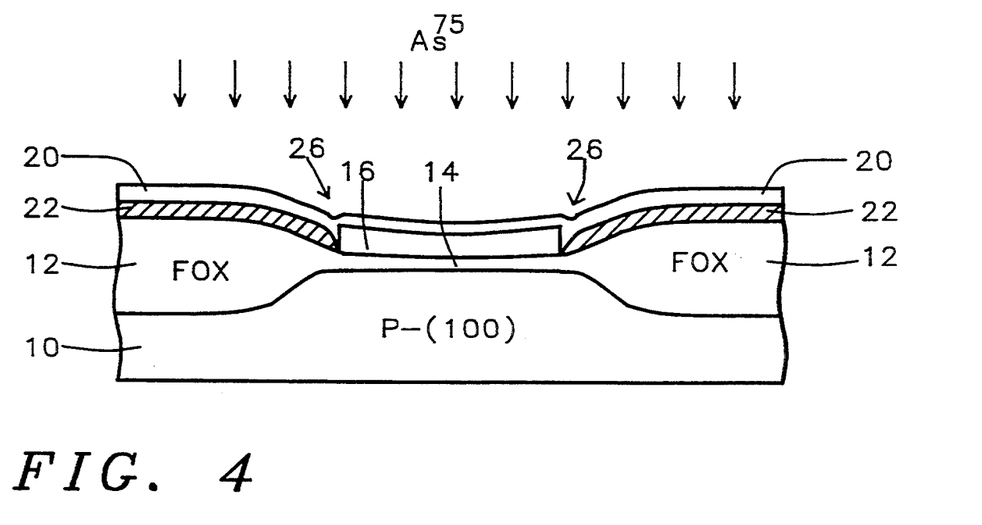
FIGS. 4 and 5 schematically illustrates in cross section representation the substrate of the second embodiment of the invention, wherein a thin sacrificial implant layer and a wet etch back step is used to form a more planar field oxide structure.
Figure 5:
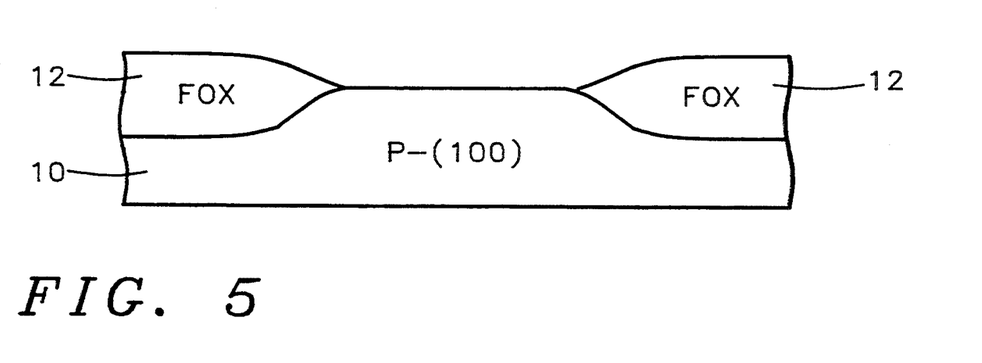

Referring now more specifically to FIGS. 4 and 5, a second embodiment of the invention is described in which a sacrificial implant layer is used to form a more planar field oxide (FOX) structure. The process flow of this embodiment is identical to the first embodiment up to and including the formation of the field oxide structure 12 by the LOCOS process. This field oxide (FOX) structure 12 with the silicon nitride layer 16 and the pad oxide layer 14 still in place is shown in FIG. 4.

Also shown in FIG. 4, a thin sacrificial implant layer 20 is deposited on the substrate surface covering the silicon nitride layer 16, the FOX structure 12 and filling the gaps 26 there between. The preferred deposition for layer 20 is a low temperature silicon oxide deposition, such as a chemical vapor deposition (CVD) using tetraethoxysilane (TEOS) as the reactant gas and a process temperature in the range of between about 600° to 900° C. The preferred thickness of layer 20 is between about 150 to 500 Angstroms. Alternatively, an oxynitride layer can also be used, for example, by reacting silane ($SiH_4$) with nitrous oxide ($N_2O$) and ammonia ($NH_3$). Still another material that can be used as layer 20 is an anti-reflective coating, such as type TSP-4 manufactured by the Tokyo Ohka Kogyo Co. of Japan. For example, some other anti-reflective coating materials that can be used include perfluoroalkylpolyether (PFAE) supplied by Montefluos, polysiloxane (SH410) supplied by Toray Industries, polyethylvinylether (PEVE) produced by Scientific Polymer Products Incorporated and polyvinyl-alcohol (PVA) provided by Kurare, Incorporated. The anti-reflective coating PFAE can be removed in FREON TF provided by the Mitsui Dupont Fluoro Chemical company and polysiloxane is removed in xylene, while PEVE and PVA are water soluble. The advantage of using these particular anti-reflective coating is that they can be easily removed by solvents or in water.

Still referring to FIG. 4., the substrate surface having the sacrificial implant layer 20 thereon, is now implanted with ions. The ion implantation is performed as described in the first embodiment, however, in this second embodiment the tilt angle is not critical and can be, for example, between about 0 to 70 degrees. A tilt angle of 0 degrees is, however, preferred so as to maximize the depth of the implant damage layer 22 in the field oxide structure 12, as shown by the cross hatched area in FIG. 4.

The ions are implanted with sufficiently high energy to penetrate the layer 20 and thereby form an implant damage layer 22 in the field oxide structure 12, as shown in FIG. 4. However, the sacrificial implant layer 20 is sufficiently thick in the gap regions, depicted as regions 26 in FIG. 4, to prevent implant damage from occurring in the field oxide 12 adjacent to the silicon nitride layer 16. This allows higher implant energies to be used which forms a deeper implant damage layer in the field oxide structure 12. For example, if an ion implant energy of 140 KeV is used at normal incidence (zero tilt angle) the projected range for $As^{75}$ in $SiO_2$ is about 650 Angstroms and 3 times the standard deviation or projected straggle is about 600 Angstroms. This damaged layer, when wet etched in buffered hydrofluoric acid, will results in a reduction of the field oxide thickness by about 1400 Angstroms and make more planar the field oxide structure.

The preferred implantation species is arsenic ions ($As^{75}$) with a preferred implant dose of between about 2 E 13 to 1 E 15 ions/$cm^2$ but more specifically having a value greater than 2 E 13 ions/$cm^2$. The ion implant energy of choice is between about 100 to 200 Kev and more specifically having a value of 140 Kev. An alternatively implant species is phosphorus ($p^{31}$) ions having a preferred implant dose of between about 5 E 13 to 1 E 15 ions/$cm^2$ but more specifically having a value which is at least greater than 5 E 13 ions/$cm^2$. The implant energy being between about 50 to 100 KeV.

The sacrificial layer 20, composed of silicon dioxide, and the implant damage layer 22 in the top surface of the field oxide structure 12, are now removed using a 10:1 dilute hydrofluoric acid (HF) solution. Alternatively, if the anti-reflective coating is used as layer 20, then layer 20 is removed by solvent or water rinse prior to etching the implant damage layer 22 in the HF solution.

Because the implant damaged layer 22 etches much faster than the undamaged portion of the field oxide structure 12, the damaged layer 22 is selectively removed and the field oxide structure 12 is made more planar. The different in etch removal of the damaged vs the undamaged oxide is a function of the ion species, ion dose and ion energy. This etch rate dependence was described in detail in the first embodiment with reference to FIG.9.

Finally shown in FIG. 5, is the completed field oxide structure after removal of the silicon nitride layer 16 and the pad oxide layer 14. The field oxide structure 12 which electrically isolates the device areas is now substantially more planar and provides an improved surface upon which to patterning the electrically conducting layers, by anisotropic etching, free of stringers or rails which can cause shorts between the conducting lines.

Figure 6:
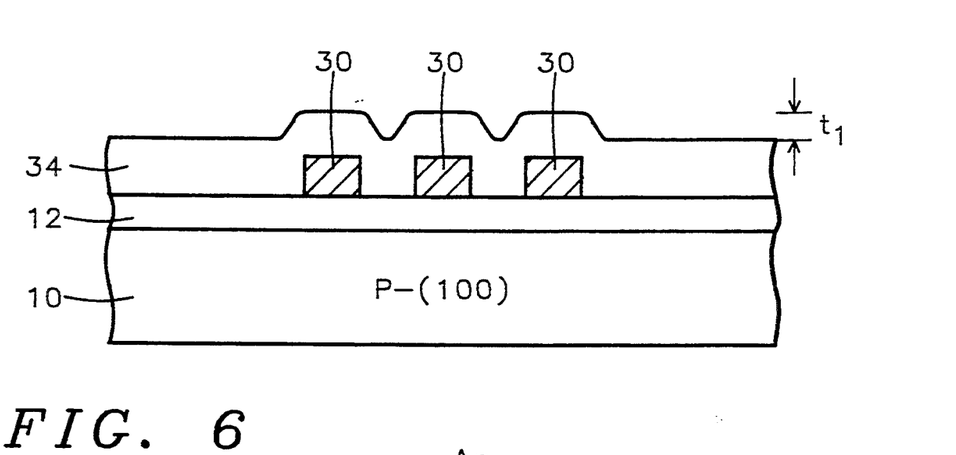
FIG. 6 through 8 schematically illustrates in cross section representation the substrate for the third embodiment in which a thin sacrificial implant layer and etching of the damaged oxide forms a more planar surface in a silicon oxide layer over a patterned conducting layer.
Figure 7:
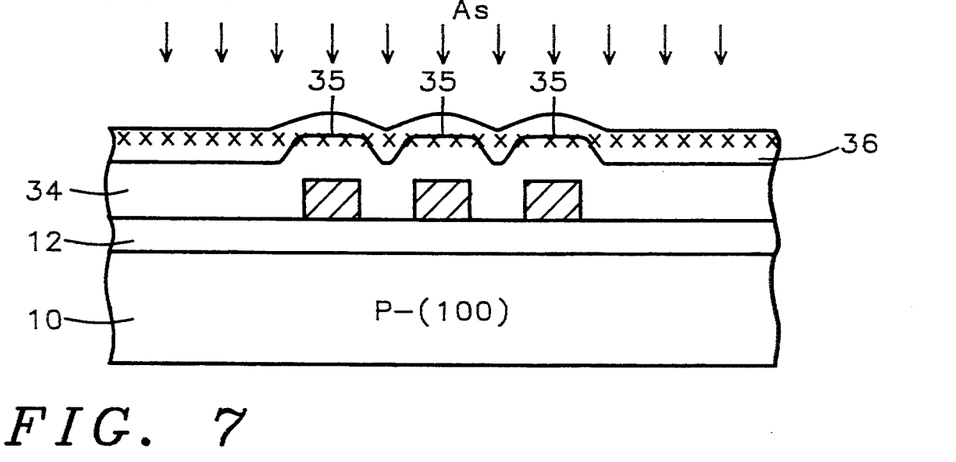
Figure 8:
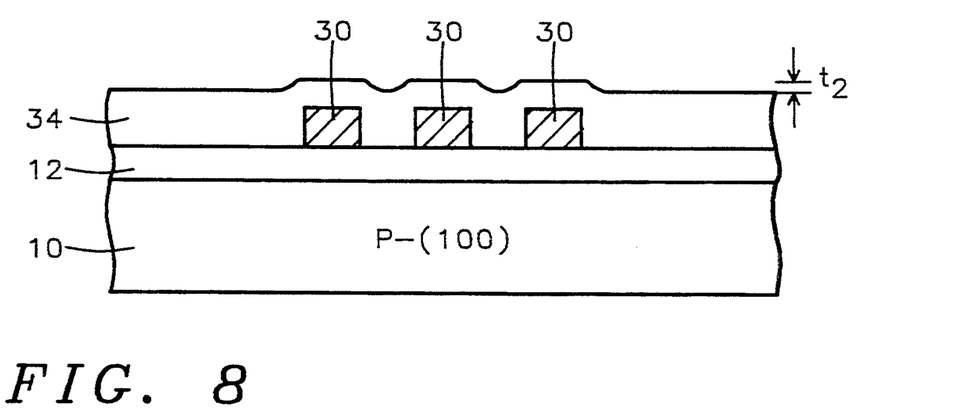

Referring now more specifically to FIGS. 6 through 8, a third embodiment of this invention is given which provides a method for planarizing an insulating layer over closely spaced electrically conducting lines. The method begins by first providing a substrate having an insulating layer 12 on the substrate surface. For simplicity of description, the insulator can be a field oxide area 12 in a region having no device areas, as shown in FIG. 6.

Referring still to FIG. 6, a patterned conducting layer 30 is formed on the substrate by conventional photolithographic techniques an anisotropic etching. For example, the patterned layer 30 can be composed of polysilicon forming the submicrometer wide gate electrodes and word lines of DRAM and SRAM circuits. The patterned layer 30 can also be conducting interconnecting metal lines, for example, composed of an aluminium or aluminium alloy. Typically the thickness of layer 30 is between about 3000 to 5000 Angstroms.

A conformal insulating layer 34 is deposited over and electrically insulating the patterned conducting layer 30, so that a second patterned conducting layer, not shown in the FIGS. 6-8, can be formed thereon. However, as previously mentioned, it is important to have a planar surface on which to pattern the conducting layer in order to avoid residue that can cause intralevel shorts.

The method for making planar the insulating layer 34, begins by depositing a sacrificial implant layer 36, as shown in FIG. 7. The preferred sacrificial implant layer 36 is a Spin-On-Glass (SOG), for example a type AS111, AS211 or a type AS311 SOG manufacture by the Allied Signal Company can be used. Alternatively, a photoresist can also be used for this purpose. Now by the nature of depositing the spin-on-glass by spin coating, which has a leveling effect, the recesses or gaps between the patterned layer 30 are filled forming a thick layer and the layer 36 over the patterned portion of layer 30 is thin. For example, the SOG is deposited by spin coated at a spin speed of between about 3000 to 5000 revolutions per minute (rpm) for about 10 to 60 seconds and then baked at a temperature of between about 80° to 300° C. for about 1 to 2 minutes. The preferred thickness over the patterned portions of layer 30 being between about 500 to 1500 Angstroms.

still referring to FIG. 7, the substrate surface having the sacrificial layer 36 thereon, is implanted with ions, as described in detail in the first embodiment with reference to FIG. 9. Briefly, the preferred ion species is phosphorus ($p^{31}$) and the implant tilt angle is not critical, but preferably about 0 degrees. The implant dose for $p^{31}$ is between about 5 E 13 to 1 E 15 ions/$cm^2$ but should not be less than 5 E 13 ions/$cm^2$. The preferred ion implant energy is between about 100 to 300 KeV. Under these implant conditions the projected range of the ion implant in the silicon oxide layer 34 is between about 1000 to 3000 Angstroms and the three times standard deviation or projected straggle is between about 1000 to 3000 Angstroms.

As shown in FIG. 7, the implanted ions penetrate the thin SOG coating creating implant damage in the insulating layer 34 over the patterned conducting layer 30, as indicated by 35, while the thick SOG filling the gaps protects the insulating layer 34 in those areas from implant damage. The SOG is now stripped using conventional means, such as in xylene or acetone, and the insulating layer 34, composed of silicon oxide is subjected to a dilute hydrofluoric acid etch. The implant damaged oxide etches rapidly while the undamaged oxide etches much slower, as described previously in the first embodiment. The planarizing effect is shown in FIG. 8, where the height of the step $t_2$ in layer 34 is significantly reduced from the original height of the step, as indicated in FIG. 6 by $t_1$.

While the invention has been particularly shown and described with reference to the preferred embodiments thereof, it will be understood by those skilled in the art that various changes in form and details may be made without departing from the spirit and scope of the invention.

What is claimed is:

1. A method for planarizing a field oxide (FOX) structure areas on a silicon substrate having device areas thereon, comprising the steps of:
   providing a silicon substrate having a principle surface that is planar;
   thermally oxidizing said silicon substrate principle surface and thereby forming a silicon oxide pad layer;
   depositing a first insulating layer on said silicon oxide pad layer and thereby forming a barrier layer to oxidation;
   patterning said first insulating layer and said silicon oxide pad layer by photoresist masking and anisotropic etching, thereby leaving portions of said first insulating layer and silicon oxide pad layer over said device areas and exposing elsewhere said substrate surface;
   removing said photoresist masking;
   thermally oxidizing said silicon substrate forming a Field OXide (FOX) structure composed of silicon oxide on and in said exposed surface areas, a portion of which extends upward above the surface of said substrate and surrounds said device areas;
   Implanting with ions by ion implantation thereby forming a damaged layer in said raised portion of said field oxide layer and thereby increasing the etch rate of said field oxide layer;
   blanket etching back said damaged layer in said field oxide structure raised portions, thereby planarizing said field oxide structure;
   removing said first insulating layer and said silicon oxide pad layer and completing said planar field oxide structure surrounding and isolating said device areas.

2. The method of claim 1, wherein said silicon oxide pad layer is thermally grown to a thickness of between about 100 to 500 Angstroms.

3. The method of claim 1, wherein the first insulating layer is composed of silicon nitride ($Si_3N_4$) having a thickness of between about 1000 to 2500 Angstroms.

4. The method of claim 1, wherein said ion species of said ion implantation is arsenic ($As^{75}$) having an implant dose greater than 5 E 13 ions/cm2 and having an implant energy of between about 50 to 100 KeV.

5. The method of claim 1, wherein said ion species of said ion implantation is phosphorus ($p^{31}$) having an implant dose greater than 5 E 13 ions/cm$^2$ and having an implant energy of between about 30 to 50 KeV.

6. The method of claim 1, wherein said silicon substrate is rotated during said ion implantation.

7. The method of claim 1, wherein the normal direction of said substrate surface being tilted to the ion beam direction of said ion implantation by an angle of 0 degrees.

8. The method of claim 1, wherein the normal direction of said substrate surface being tilted to the ion beam direction of said ion implantation by an angle of between about 0 to 60 degrees.

9. The method of claim 1, wherein said blanket etch back is performed in a buffered hydrofluoric acid solution having a mixture containing between about 10 to 100 parts by volume of water ($H_2O$) to 1 part of hydrofluoric acid (HF).

10. A method for planarizing a field oxide (FOX) areas on a silicon substrate having device areas thereon, comprising the steps of:
    providing a silicon substrate having a principle surface that is planar;
    thermally oxidizing said silicon substrate principle surface and thereby forming a silicon oxide pad layer;
    depositing a first insulating layer on said silicon oxide pad layer and thereby forming a barrier layer to oxidation;
    patterning said first insulating layer and said silicon oxide pad layer by photoresist masking and anisotropic etching, thereby leaving portions of said first insulating layer and silicon oxide pad layer over said device areas and exposing elsewhere said substrate surface;
    removing said photoresist masking;
    thermally oxidizing said silicon substrate forming a Field OXide (FOX) structure composed of silicon oxide on and in said exposed surface areas, a portion of which extends upward above the surface of said substrate and surrounds said device areas;
    depositing on said silicon substrate a second insulating layer and thereby filling the gaps between said patterned first insulating layer and raised portion of said field oxide structures;
    Implanting with ions by ion implantation through said second insulating layer, thereby forming a damaged layer in said raised portion of said field oxide layer and thereby increasing the etch rate of said field oxide layer;
    blanket etching back said second insulating layer and said damaged layer in said field oxide structure raised portions, thereby planarizing said field oxide structure;
    removing said first insulating layer and said silicon oxide pad layer and completing said planarized field oxide structure surrounding and isolating said device areas.

11. The method of claim 10, wherein said silicon oxide pad layer is thermally grown to a thickness of between about 100 to 500 Angstroms.

12. The method of claim 10, wherein the first insulating layer is composed of silicon nitride ($Si_3N_4$) having a thickness of between about 1000 to 2000 Angstroms.

13. The method of claim 10, wherein said second insulating layer is deposited by chemical vapor deposition (CVD) and composed of silicon oxide and having a thickness of between about 150 to 500 Angstroms.

14. The method of claim 10, wherein said second insulating layer is composed of silicon oxynitride and having a thickness of between about 150 to 500 Angstroms.

15. The method of claim 10, wherein said second insulating layer is composed of polyethylvinylether (PEVE) and having a thickness of between about 300 to 800 Angstroms.

16. The method of claim 15, wherein said second insulating is removed by a water rinse after said ion implantation prior to said etch back.

17. The method of claim 10, wherein said ion species of said ion implantation is arsenic ($As^{75}$) having an implant dose greater than 2 E 13 ions/$cm^2$ and having an implant energy of between about 100 to 200 KeV.

18. The method of claim 10, wherein said ion species of said ion implantation is phosphorus ($p^{31}$) having an implant dose greater than 5 E 13 ions/$cm^2$ and having an implant energy of between about 50 to 100 KeV.

19. The method of claim 10, wherein said silicon substrate is rotated during said ion implantation.

20. The method of claim 10, wherein the normal direction of said substrate surface being tilted to the ion beam direction of said ion implantation by an angle of between about 0 to 70 degrees.

21. The method of claim 10, wherein said blanket etch back is performed in a dilute hydrofluoric acid solution having a mixture containing between about 10 to 100 parts by volume of water ($H_2O$) to 1 part of hydrofluoric acid (HF).

22. A method for planarizing a silicon oxide layer on a semiconductor substrate having a patterned conducting layer thereon, comprising the steps of:
    providing a semiconductor substrate having semiconductor devices formed in and on said substrate and having a patterned conducting layer formed thereon;
    depositing a conformal silicon oxide layer on said substrate and said patterned conducting layer, said silicon oxide layer being higher over said patterned conducting layer;
    coating an implant planarizing layer on said silicon oxide layer, being thin over said patterned conductor layer areas and thick between said patterned conducing layer areas;
    implanting with ions by ion implantation through said thin portions of said planarizing layer, thereby forming a damaged layer in said elevated portions of said silicon oxide layer, thereby increasing the etch rate of said silicon oxide layer over said patterned conducting layer;
    removing said implant planarizing layer and exposing said silicon oxide layer there under;
    blanket etching back said silicon oxide layer and said damaged layer and thereby making more planar said silicon oxide layer.

23. The method of claim 22, wherein said conformal silicon oxide layer is formed by low pressure chemical vapor deposition (LPCVD) having a thickness of between about 3000 to 10000 Angstroms.

24. The method of claim 22, wherein said implant planarizing layer is composed of photoresist having a thickness of between about 500 to 1500 Angstroms over said patterned conducting layer.

25. The method of claim 22, wherein said implant planarizing layer is composed of spin-on-glass (SOG) having a thickness of between about 500 to 1500 Angstroms over said patterned conducting layer.

26. The method of claim 22, wherein said ion species of said ion implantation is arsenic ($As^{75}$) having an implant dose greater than 2 E 13 ions/$cm^2$ and having an implant energy of between about 150 to 500 KeV.

27. The method of claim 22, wherein said ion species of said ion implantation is phosphorus ($p^{31}$) having an implant dose greater than 5 E 13 ions/$cm^2$ and having an implant energy of between about 100 to 300 KeV.

28. The method of claim 22, wherein said silicon substrate is rotated during said ion implantation.

29. The method of claim 22, wherein the normal direction of said substrate surface being tilted to the ion beam direction of said ion implantation by an angle of between about 0 to 70 degrees.

30. The method of claim 22, wherein said blanket etch back is performed in a buffered hydrofluoric acid solution having a mixture containing between about 10 to 100 parts by volume of water (H2O) to 1 part of hydrofluoric acid (HF).

31. A method for planarizing a silicon oxide layer on a semiconducting substrate having device areas formed thereon, comprising the steps of:
    providing a semiconducting substrate having at least one substantially planar surface, said substrate comprising silicon;
    providing partially completed device structures in and on said substrate and, furthermore having a silicon oxide layer on said substrate having raised portions;
    implanting by ion implantation said raised portions of said silicon oxide layer and forming an implant damage region in said silicon oxide layer, and said silicon oxide layer having a higher etch rate than the non-implanted silicon oxide portions;
    wet etching said silicon oxide layer and, thereby removing at a higher etch rate said implant damaged regions of said silicon oxide layer raised portions and completing said planarization.

32. The method of claim 31, wherein said silicon oxide layer comprises a Field OXide structure formed by the LOCal Oxidation of Silicon (LOCOS) method.

33. The method of claim 31, wherein said silicon oxide layer comprises a chemical vapor deposited (CVD) oxide deposited over patterned conducting layers.

* * * * *